Sept. 12, 1967 A. M. SETHNA 3,341,780

DELAYED AUTOMATIC GAIN CONTROL SYSTEM UTILIZING THE PLATEAU REGION OF AN AMPLIFIER TRANSISTOR

Filed Feb. 3, 1964 2 Sheets-Sheet 1

INVENTOR.
Anil M. Sethna
BY Mueller & Aichele
Attys.

INVENTOR.
Anil M. Sethna
BY Mueller & Aichele
Attys.

United States Patent Office 3,341,780
Patented Sept. 12, 1967

3,341,780

DELAYED AUTOMATIC GAIN CONTROL SYSTEM UTILIZING THE PLATEAU REGION OF AN AMPLIFIER TRANSISTOR

Anil M. Sethna, Chicago, Ill., assignor to Motorola, Inc., Franklin Park, Ill., a corporation of Illinois Filed Feb. 3, 1964, Ser. No. 342,061
3 Claims. (Cl. 325—405)

ABSTRACT OF THE DISCLOSURE

A radio frequency amplifier transistor in a wave signal receiver has a plateau region within which its gain is not affected when its bias is changed in a given direction, whereas a further bias change decreases its gain. The transistor is quiescently biased at a predetermined point in the plateau region. An intermediate frequency amplifier transistor is quiescently biased at a point where its gain decreases substantially immediately when its bias changes. The automatic gain control system concurrently changes the bias on the two transistors so that gain control of the radio frequency transistor is delayed.

This invention relates to transistorized wave signal receivers in general, and in particular to an improved automatic gain control circuit especially suitable for transistorized television receivers.

It is known to supply an automatic gain control signal proportional to received signal strength to the intermediate frequency (IF) stages and often to the radio frequency (RF) stages of a transistorized wave signal receiver to maintain the amplitude of the detected signal substantially constant over a range of received signal strength. However, in the presence of weak signals, or under conditions of fringe area reception in the case of television receivers, it is desirable to operate the transistors ofthe RF stages at maximum gain for improved noise characteristics. On the other hand, in strong signal areas high gain in the RF stages often results in overloading and thus distortion of the transistors in the IF stages. Therefore, numerous circuit arrangements have been proposed to delay application of the automatic gain control signal to the transistors of the RF stages of the receiver until the received signal exceeds a certain level. In some instances a range switch is utilized so that in fringe areas the AGC signal is applied to the IF stages only, while in strong signal areas the AGC signal may be applied to both the IF and the RF stages of the receiver. Other known delayed AGC circuits utilize dual detectors, each biased for the different threshold voltage, for deriving the AGC signal from the carrier wave. Still other circuits rely on sequential change of the operating point of the transistors of cascaded direct current coupled amplifier stages to obtain the desired delayed AGC action. These and other prior art systems are relatively complex and require the use of additional circuit components, and provide less than satisfactory operation over a wide range of varying signal conditions.

It is therefore among the objects of the present invention to provide an improved automatic gain control circuit arrangement for use in transistorized wave signal receivers.

Another object is to provide an automatic gain control system having RF delay for use in transistorized television receivers, which system is simple and economical to construct and which system provides reliable, distortion free operation over a wide range of incoming signal strength.

Still another object of the invention is to provide an automatic gain control system for a transistorized wave signal receiver in which the transistors in the RF stages of the receiver provide RF gain control delay without the use of additional circuit components.

A feature of the present invention is the provision of an improved automatic gain control system for wave signal receivers in which the base bias current versus current gain characteristics of the transistors in the RF stages are utilized to obtain delay before gain control action takes over in the RF stages of the receiver.

Another feature is the provision of a circuit arrangement in which a transistor in the RF stage of a wave signal receiver maintains its gain substantially constant with the increasing base bias current produced by AGC action until the input signal strength to the receiver has reached a predetermined level, subsequent to which gain decreases with increasing base bias current. As a result, the AGC action of the transistor in the RF stage is delayed so that the receiver may be used in the area of widely varying signal strength without an increase in noise or without the occurrence of overload distortion.

A further feature of the invention is the provision of an automatic gain control circuit for use in a transistorized television receiver in which a transistor in the RF stage is normally biased to a plateau of its base bias current versus current gain curve so that the application of forward AGC action therein is delayed in the presence of low level signals.

Other objects, features and attending advantages of the invention will become apparent from the following description when taken in conjunction with the accompanying drawings, in which.

In practicing the invention forward AGC is applied to the RF and IF stages of a wave signal receiver, which for the purposes of illustration may be considered to be a television receiver. It is to be understood, however, that the invention may be practiced with other types of receivers for signals in the radio frequency spectrum of the superheterodyne type in which radio frequency and intermediate frequency transistor amplifier stages are provided. Forward AGC is a type of biasing wherein base current of selected transistors in the gain controlled stages of the receiver is increased from a predetermined point on their base current versus current gain curve to drive them towards saturation for reduced current gain in the presence of increased signal strength. This type of AGC action is preferable in transistorized receivers in that it results in less distortion and noise while at the same time providing greater power handling capabilities.

It has been found that a number of commercially available transistor types suitable for use as RF amplifiers in wave signal receivers exhibit a flat region or plateau on their base current versus current gain characteristic curve such that for a finite range, at or near the point of maximum gain, substantially no further current gain is experienced with increased base current. Accordingly, a biasing circuit is provided to supply a quiescent base current bias for selected RF transistors to provide current gain at this plateau, and an AGC control signal is utilized to change base current in response to the level of the received television signal. With increased incoming signal strength and thus a proportionate increase in the AGC control signal there is no effective decrease in current gain of the RF transistors until base current increases beyond the plateau region. Concurrently the AGC control signal is applied to transistors of the IF stages of the receiver that are biased such that forward AGC action takes place either immediately or with substantially less increase in base current than is necessary to reduce the current gain of the RF transistor. As a result there is a delay in the forward AGC action of the transistors of the RF stages until the incoming signal strength exceeds a predetermined level.

Figure 1:
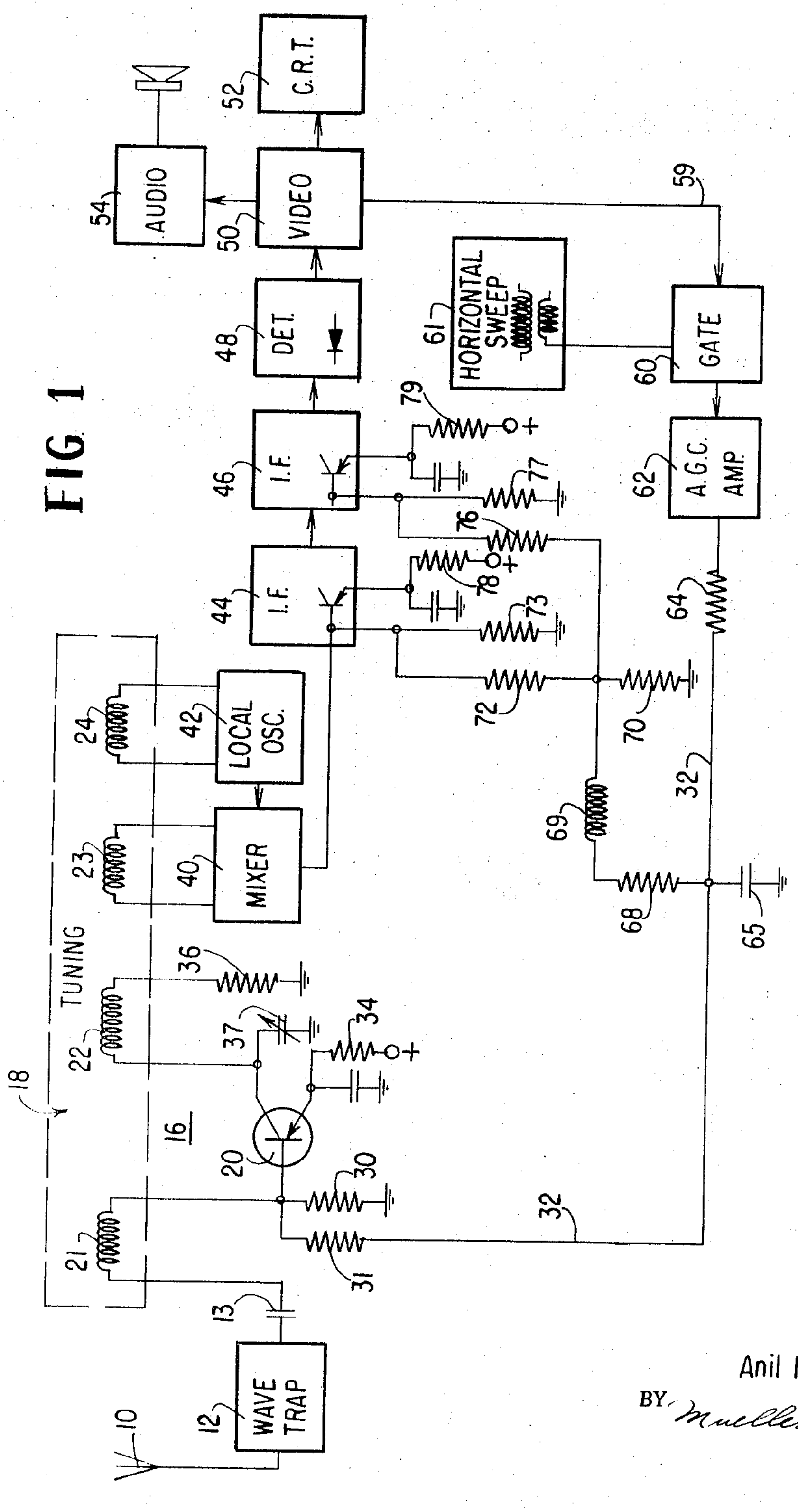
FIG. 1 is a schematic diagram illustrating one form of the invention.

Referring now to FIG. 1, wherein the delayed automatic gain control system of the invention is shown in conjunction with a transistorized television receiver, incoming carrier wave signals received at antenna 10 are coupled to wave trap 12 and then by capacitor 13 to the RF section of the receiver shown generally at 16. Wave trap 12 may include a plurality of frequency sensitive networks and the necessary balun transformers for matching the antenna portion of the receiver with radio frequency section 16.

Radio frequency section 16 includes a tuning section 18 and RF transistor 20. As is conventional practice tuning section 18 may include four sets of tuning coils 21, 22, 23 and 24, with only representative ones being shown, for tuning the input and output of RF transistor 20, the input of the mixer, and for tuning the local oscillator of the superheterodyne television receiver. It is to be understood that in a practically constructed receiver tuning section 18 includes a plurality of coils, represented by coils 21–24, that may be ganged for switching so that a desired TV channel can be selected.

Tuning coil 21 is coupled between capacitor 13 and the input base electrode of RF transistor 20. The base electrode of transistor 20 is also connected to the junction point between resistors 30 and 31, which resistors are series connected between ground reference potential and AGC lead 32. Emitter voltage is supplied to transistor 20 through by-pass resistor 34, and is positive for the PNP transistor shown. Output signals are developed across tuning coil 22, which is connected in series with resistor 36 between the collector electrode of transistor 20 and ground reference potential. Capacitor 37 is connected between the collector electrode of transistor 20 and ground reference potential to provide means for fine tuning of the output of transistor 20.

Interaction between coils 22 and 23 couple the RF output of transistor 20 to the input of mixer 40. A second input for mixer 40 is derived from local oscillator 42, tuned by coil 24. The intermediate frequency signal derived from mixer 40 is coupled to intermediate frequency amplifier stages 44 and 46 and hence to video detector 48. The detected composite video signal provided by detector 48 is amplified by video amplifier stage 50 to provide drive for cathode ray tube 52. As is standard practice, the audio subcarrier is also obtained from video amplifier stage 50 and supplied to audio system 54 of the receiver.

To provide automatic gain control signal for the receiver, a portion of the detected composite video signal is derived from video amplifier stage 50 and fed on lead 59 to the input of automatic gain control gate 60. It is to be understood that as is the usual practice automatic gain control gate 60 receives a gating or keying pulse from a winding on the horizontal output transformer of horizontal sweep and high voltage system 61, and accordingly is periodically gated into conduction in time coincidence with the horizontal sweep of the receiver. This allows only the peak excusions of the synchronizing signal component of the detected composite video signal to be utilized for an automatic gain control reference. Accordingly, a signal is developed at the output of automatic gain control gate 60 which is proportional to the tips of the synchronizing pulses of the detected composite video signal.

The output of AGC gate 60 is coupled to the input of AGC amplifier 62. AGC amplifier 62 includes a control transistor having its output coupled to the biasing circuit arrangements for the transistors of the RF and IF stages of the receiver, and supplies a gain control signal thereto in response to the output of AGC gate 60 to produce the required AGC action. To this end, the output of AGC amplifier 62 is supplied through resistor 64 to AGC bus 32. Capacitor 65 is connected between AGC bus 32 and ground reference potential to provide filtering and bypass for high frequency components. It is to be noted that one branch of AGC bus 32 is connected by resistor 31 to the base electrode of RF transistor 20, while a second branch of AGC bus 32 is connected through the series combination of resistor 68 and coil 69 to one side of resistor 70 so that an AGC signal may be distributed to the base electrodes of transistors of selected IF stages of the receiver.

As is representatively shown, each of IF stages 44 and 46 may include a PNP transistor. Resistors 72 and 73 are series connected between the side of resistor 70 common to choke 69 and ground reference potential. The junction point between resistors 72 and 73 provides a voltage divider to supply a voltage that produces bias current for the base electrodes of the transistor of IF stage 44. In a similar manner, the junction point between resistors 76 and 77 is connected to supply a voltage to produce bias current for the base electrode of the transistor of IF stage 46. As is conventional practice, a third IF stage (not shown) may be fixed biased and not provided with automatic gain control. This allows the third IF stage to be selectively tuned for maximum selectivity of the receiver.

The magnitude and polarity of the signal on AGC bus 32, as derived from AGC amplifier 62, is selected to provide the desired quiescent operating point for RF transistor 20 and for the transistors in IF stages 46 and 44. With PNP transistors as shown, this signal is negative with respect to the emitter voltage to thereby forward bias the emitter-base diode of each of the mentioned transistors. Thus, for RF transistor 20 the voltage division ratio between resistors 30 and 31 maintains its base electrode negative with respect to its emitter electrode, while in a like manner the voltage division ratio between resistors 72 and 73 and between resistors 76 and 77 maintains the base electrodes of the transistors of IF stages 44 and 46 negative with respect to a positive voltage applied to their emitter electrodes through bypassed resistors 78, 79. Their collector electrodes are provided with a DC return to ground reference potential by the interstage coupling network (not shown) between IF stages 44 and 46. To provide the desired forward AGC action the output of AGC amplifier 62, responsive to the signal developed by AGC gate 60, becomes less positive with increased output of AGC gate 60. Thus, in the presence of increasing incoming signal strength the signal on AGC bus 32 is driven more negative with respect to a predetermined level. This increases base-emitter bias for RF transistor 20 and for the transistors of IF stages 44 and 46, resulting in more base current and driving them towards saturated conduction.

Figure 2:
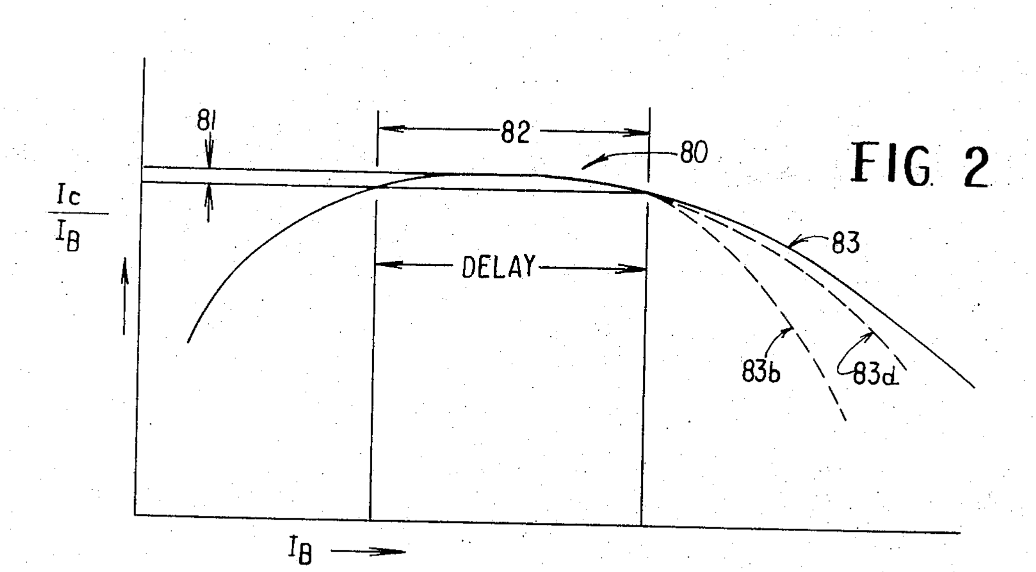
FIG. 2 is a plot of base current versus current gain for a typical RF transistor useful in understanding the operation of the invention.

As previously mentioned, the base electrode of RF transistor 20 is biased to a point on its emitter current versus current gain curve such that its gain is maximized and substantially constant for a finite increase of base current. This point may be readily established by proper selection of the voltage dividing ratio between resistors 30 and 31. Operation of the system is best understood with reference to the curve of FIG. 2, in which current gain ($I_c/I_b$) is represented on the vertical axis and base bias current ($I_b$) is represented on the horizontal axis. Current gain curve 80 is for a constant collector voltage. It can be seen that for a given range of base current 82, current gain of RF transistor 20 is substantially constant. For most suitable RF transistors the change in current gain, indicated by reference numeral 81, will be less than 10%. Increasing base current beyond this range, as shown in region 83 of current gain curve 80, results in a decrease in current gain with increased base current. The rate of this decrease is a characteristic of the particular transistor utilized, and may decrease even more rapidly for selected types, as shown by curves **83*a* and 83*b*. It is in region 83** of the selected current gain versus base current operating curve that forward bias AGC action is achieved, such that with increasing incoming signal strength the transistor is driven towards saturation for reduced gain.

The intermediate frequency stages of the receiver have a quiescent base-current bias such that a decrease in current gain takes place immediately with increased base current, or such that a substantially shorter delay than that provided for the RF transistor occurs prior to decreasing current gain with increased base current. Thus, in the completed system of FIG. 1 there is a substantial delay before forward AGC action is applied to the RF stage of the receiver. This delay in turn allows the level of the incoming signal to rise to a more desirable signal-to-noise ratio. Subsequent to this delay forward AGC action takes over in the RF stage to reduce the signal level in later stages of the receiver so that the intermediate frequency stages are not overloaded. By selecting an RF transistor which has a rapidly decreasing current gain with increasing base current subsequent to the plateau period, as is representatively shown by curve **83*b*** of FIG. 2, RF gain will decrease faster than IF gain to insure against overloading and distortion.

While the above circuit has been described in conjunction with PNP transistors for RF transistor 20 and in IF stages 44 and 46, it should be apparent that it will work with equal facility with forward bias supplied to NPN transistors in each of these stages. Such a modification is shown schematically in FIG. 3, wherein like reference numerals refer to equivalent circuit elements. The emitter electrode of RF transistor 20 and the transistors of IF stages 44 and 46 are returned to ground reference potential by resistors 34, 78 and 79 respectively. A positive voltage is applied to the collector electrode of RF transistor 20 through tuning coil 22, while a positive voltage is also applied to the collector electrodes of the transistors of IF stages 44 and 46 via their interstage coupling (not shown). The base electrode of transistor 20 and the transistors of IF stages 44 and 46 is returned to a positive potential by resistors 33, 71, and 75, respectively, to prevent reverse condition of the collector-base junction of the mentioned transistors. In addition, voltage dividing arrangements including resistors 30 and 31, 72 and 73, and 76 and 77 establish a quiescent base current bias for RF transistor 20 and the transistors of IF stages 44 and 46, respectively.

Figure 3:
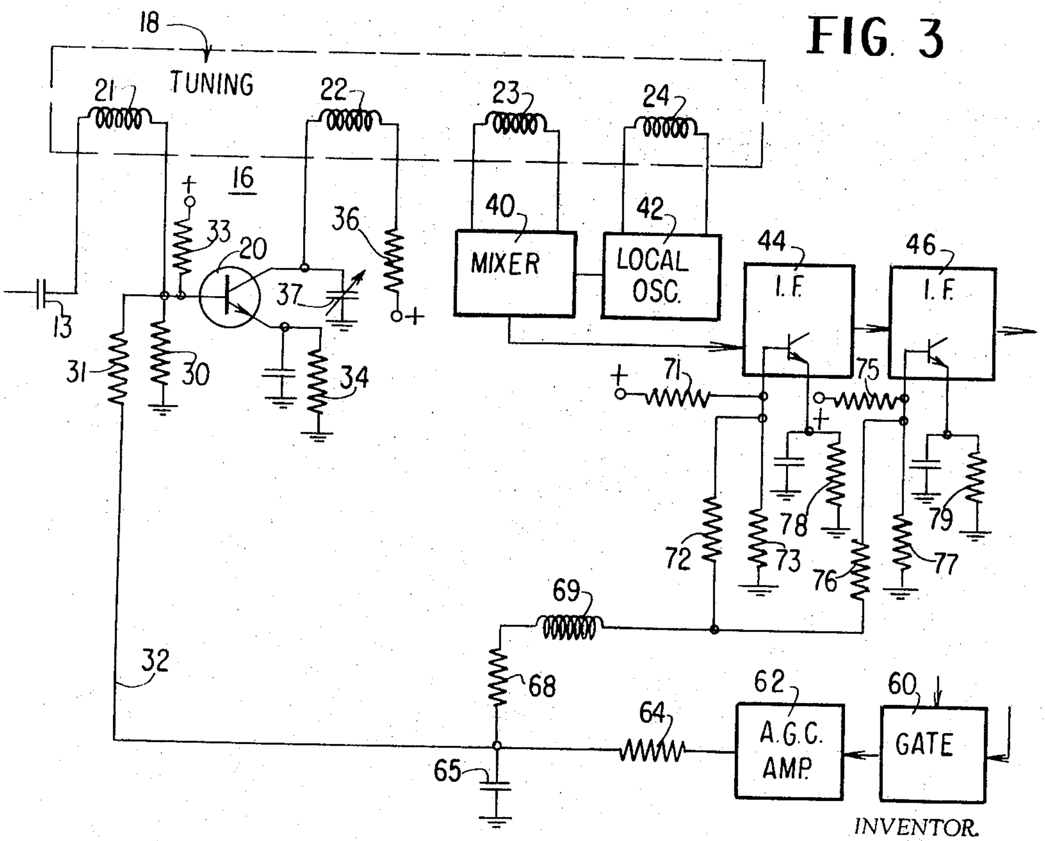
FIG. 3 is a schematic diagram of another form of the invention.

When NPN transistors are used for RF transistor 20 and the transistors of IF stages 44 and 46, as illustrated in FIG. 3, the signal on AGC bus 32 is of a magnitude and polarity such that the base electrode of transistor 20 and transistors 44 and 46 are positive with respect to their emitter electrodes. In addition, the output of AGC amplifier 62 is adapted to provide a positive going signal in response to variations in the output of AGC gate 60 in the presence of an increasing incoming signal level. Thus, a positive going AGC signal is applide to the base electrodes of transistor 20 and the transistors in IF stages 44 and 46 that increases base current to drive them towards saturated conduction at high incoming signal levels. This in turn results in delayed forward AGC in the manner discussed in conjunction with FIGS. 1 and 2. The current gain versus base bias characteristic curve of NPN transistors is identical to curve 80 of FIG. 2, which curve is representative only with respect to relative magnitudes and not by the polarity of the signals involved.

Examples of PNP transistors which may be employed as RF transistor 20 include germanium PNP epitaxial mesa diffused base transistors such as the types designated as MM1151 and MM1152. Examples of NPN transistors which may be employed as RF transistor 20 include silicon NPN epitaxial passivated transistors, such as the types designated as MF1161 and MF1162.

Transistors which may be used to provide the desired plateau and subsequent decrease in current gain include those specifically designed to induce depletion layer shift and base widening with a change of a selected DC parameter, and those having relatively small area emitter ohmic contacts. Transistors of these types may be used to particular advantage where it is desired to provide rapid current gain fall-off of the nature indicated by curve **83*b*** of FIG. 2.

The invention provides therefore a simple yet effective automatic gain control circuit having RF delay for use in transistorized wave signal receivers such as transistorized television receivers. Utilization of the current gain versus base current curve of the RF transistor allows RF delay to be obtained without the use of additional circuit components. The circuit is economical to construct and reliable in operation, resulting in a receiver which may be conveniently operated in areas of varying signal strength without an increase in noise level and without overload and distortion.

I claim.

1. An automatic gain control system for a wave signal receiver, the combination of first and second signal amplifiers each having a transistor, means coupling said first amplifier to said second amplifier, the transistor of said first amplifier having a current gain versus base current characteristic with a plateau region in which a given increase in base current results in substantially no change in current gain, and following which there is a decrease in current gain with increased base current, circuit means coupled to the transistor of said first amplifier to provide base current bias at a predetermined point on said plateau region, circuit means coupled to the transistor of said second amplifier to provide base current bias therefor such that current gain decreases substantially immediately with increased base current, and control circuit means coupled to said first and second amplifiers to supply thereto a control signal indicative of the level of an incoming signal applied to the receiver for concurrently increasing base current for said transistors with an increase in the level of the incoming signal to provide for forward bias current automatic gain control for said transistors, whereby gain control of the transistor of said amplifier is delayed a predetermined amount with respect to gain control of the transistor of said second amplifier.

2. In a transistorized television receiver for television signals, the combination of a radio frequency signal amplifier having a transistor for the television signals, an intermediate frequency signal amplifier having a transistor, means coupled from said radio frequency signal amplifier to said intermediate frequency signal amplifier for coupling signals thereto, demodulating means coupled to said intermediate frequency signal amplifier for deriving a composite video signal, the transistor of said radio frequency signal amplifier having a current gain versus base current characteristic with a plateau region in which a given increase in base current results in substantially no change in current gain, and following which there is a decrease in current gain with increased base current, first bias circuit means coupled to the transistor of said radio frequency signal amplifier for supplying base current bias at a predetermined point within said plateau region to establish the gain thereof, second bias circuit means coupled to the transistor of said intermediate frequency signal amplifier to provide base current bias therefor such that the current gain thereof decreases substantially immediately with an increase in base current, further circuit means coupled to said demodulating means for producing a control signal indicative of the level of said composite video signal, and control means coupled from said further circuit means to said radio frequency and intermediate frequency signal amplifiers and responsive to said control signal for varying the base current bias for the transistors therein to thereby produce gain reduction in said amplifiers in response to an increased level of the television signal, whereby gain reduction in said radio frequency signal amplifier is delayed with respect to gain reduction of the intermediate frequency signal amplifier.

3. An automatic gain control system for a wave signal receiver, the combination of first and second signal amplifiers each having a transistor, means coupling said first signal amplifier to said second amplifier, the transistor of said first signal amplifier having a current gain versus base current characteristic with a plateau region in which a change in the base current in a given direction causes substantially no change in its current gain, and following which there is a decrease in current gain with an additional change in base current in such given direction, circuit means coupled to the transistor of said first signal amplifier to provide base current bias at a predetermined point on said plateau region, circuit means coupled to the transistor of said second signal amplifier to provide base current bias therefor such that its current gain decreases substantially immediately with a change in its base current in a predetermined direction, and control circuit means coupled to said first and second signal amplifiers to supply thereto a control signal indicative of the level of an incoming wave signal applied to the receiver, for concurrently changing the base current of the transistor in said first signal amplifier in said given direction and changing the base current of the transistor in said second signal amplifier in said predetermined direction with an increase in the level of the incoming wave to provide automatic gain control for said transistors, whereby gain control of the transistor of said first signal amplifier is delayed a predetermined amount with respect to the gain of the transistor of said second signal amplifier.

References Cited

UNITED STATES PATENTS 3,084,216 4/1963 Tschannen ---------- 325—405

KATHLEEN H. CLAFFY, *Primary Examiner.*

R. LINN, *Assistant Examiner.*